United States Patent
Nagatomo et al.

(10) Patent No.: US 7,685,560 B2
(45) Date of Patent: Mar. 23, 2010

(54) METHOD AND APPARATUS FOR MONITORING EXPOSURE PROCESS

(75) Inventors: Wataru Nagatomo, Yokohama (JP);
Chie Shishido, Yokohama (JP);
Hidetoshi Morokuma, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 1323 days.

(21) Appl. No.: 10/988,558

(22) Filed: Nov. 16, 2004

(65) Prior Publication Data

US 2005/0221207 A1 Oct. 6, 2005

(30) Foreign Application Priority Data

Mar. 30, 2004 (JP) .............................. 2004-097562

(51) Int. Cl.
*G06F 17/50* (2006.01)
*G06K 9/00* (2006.01)
*G06F 19/00* (2006.01)

(52) U.S. Cl. ........................... 716/21; 700/121; 382/145
(58) Field of Classification Search ............. 716/19–21; 382/144–145; 430/4–5; 700/121
See application file for complete search history.

(56) References Cited

U.S. PATENT DOCUMENTS

| | | | | |
|---|---|---|---|---|
| 6,366,688 B1* | 4/2002 | Jun et al. | ..................... | 382/145 |
| 6,909,930 B2 | 6/2005 | Shishido et al. | | |
| 7,174,520 B2* | 2/2007 | White et al. | ..................... | 716/4 |
| 7,279,258 B2* | 10/2007 | Goodwin | ..................... | 430/30 |
| 7,286,247 B2* | 10/2007 | Archie et al. | ................ | 356/625 |
| 7,325,206 B2* | 1/2008 | White et al. | ..................... | 716/4 |
| 7,337,019 B2* | 2/2008 | Reiss et al. | .................... | 700/21 |
| 7,356,377 B2* | 4/2008 | Schwarm | ..................... | 700/108 |
| 7,457,736 B2* | 11/2008 | Chang | ......................... | 703/13 |
| 2003/0139054 A1* | 7/2003 | Fujimoto | ..................... | 438/725 |
| 2004/0032979 A1* | 2/2004 | Honda et al. | ................ | 382/145 |
| 2004/0228515 A1* | 11/2004 | Okabe et al. | ................ | 382/145 |
| 2004/0267399 A1* | 12/2004 | Funk | ......................... | 700/121 |

(Continued)

FOREIGN PATENT DOCUMENTS

JP 2003-173948 6/2003

(Continued)

OTHER PUBLICATIONS

Office Action issued in Japanese Patent No. 2004-097562 on Mar. 24, 2009.

*Primary Examiner*—Stacy A Whitmore
(74) *Attorney, Agent, or Firm*—Antonelli, Terry, Stout & Kraus, LLP.

(57) ABSTRACT

An exposure process monitoring method capable of performing quantitative monitoring of an exposure amount and a focusing position which are major process parameters during exposure using a Levinson phase shift mask in semiconductor lithography processes is disclosed. During exposure using the Levinson phase shift mask, the focus position is influenceable by optical intensity distribution characteristics so that it can vary from its minus (−) to plus (+) directions by in a way depending upon the pitch width and line width of a line-and-space pattern. In such case, there exist a pattern in which the cross-sectional shape of a resist changes from a forward taper to reverse taper and a pattern in which the sectional shape changes from the reverse to forward taper.

14 Claims, 16 Drawing Sheets

U.S. PATENT DOCUMENTS

| | | | |
|---|---|---|---|
| 2005/0112475 A1* | 5/2005 | Sato et al. | 430/5 |
| 2006/0062445 A1* | 3/2006 | Verma et al. | 382/144 |
| 2006/0251317 A1* | 11/2006 | Eran et al. | 382/144 |
| 2007/0117030 A1* | 5/2007 | Laidig et al. | 430/5 |
| 2008/0192221 A1* | 8/2008 | Mieher et al. | 355/55 |

FOREIGN PATENT DOCUMENTS

| | | |
|---|---|---|
| JP | A-2003-173948 | 6/2003 |
| JP | 2003-347201 | 12/2003 |

* cited by examiner

MASK PATTERN-DEPENDENT RESIST PROFILE DIFFERENCE

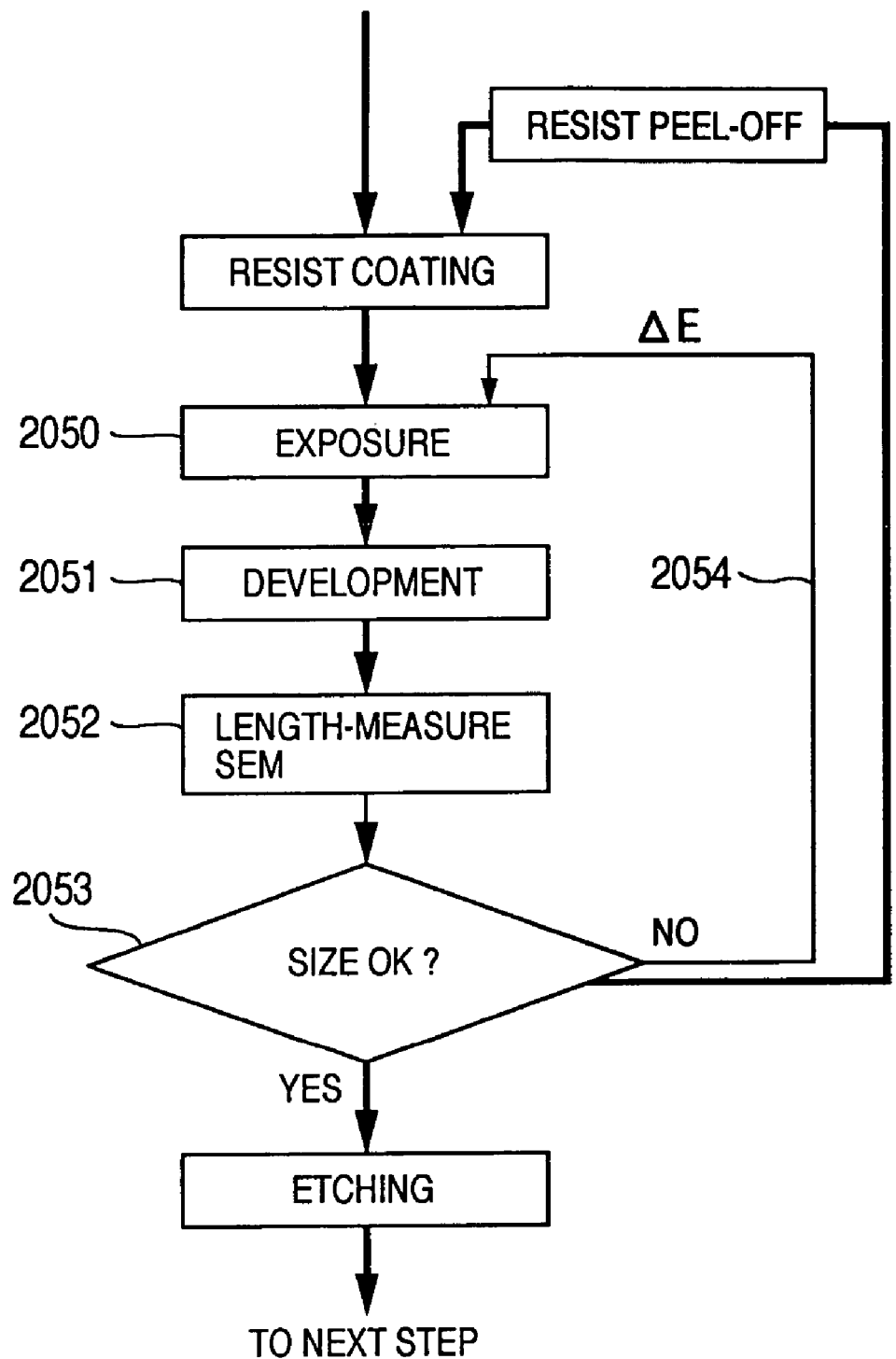

W1: RESIST PATTERN'S BOTTOM WIDTH
θ : RESIST PATTERN TILT ANGLE
W2: FILM PATTERN WIDTH

PITCH WIDTH B, LINE WIDTH A
3000, 3002, 3001

(a) PROFILE TO BE MEASURED — 702

(b) SECONDARY ELECTRON SIGNAL WAVEFORM f1: PATTERN WIDTH (BOTTOM WIDTH)
f2: WHITE BAND WIDTH
f3: PATTERN WIDTH (TOP WIDTH)
f4: PATTERN WIDTH (MAX. TILT POINT INTERVAL)
f5: AVE. WIDTH INSIDE WHITE BAND (REFLECTING ROUNDING OF RESIST TOP)
f6: AVE. WIDTH OUTSIDE WHITE BAND (REFLECTING ROUNDING OF RESIST BOTTOM)

FIG.8A
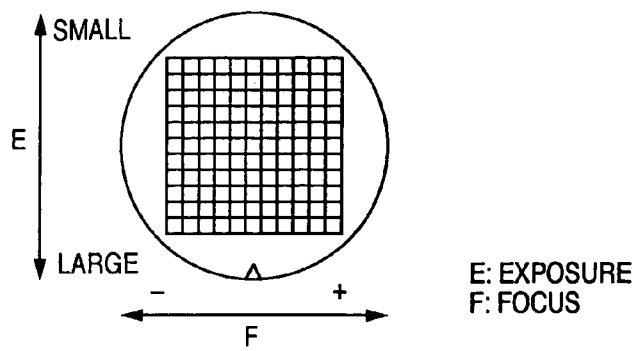
E: EXPOSURE
F: FOCUS
FIG.8B
ORIGINAL DATA $m_k(E,F)$
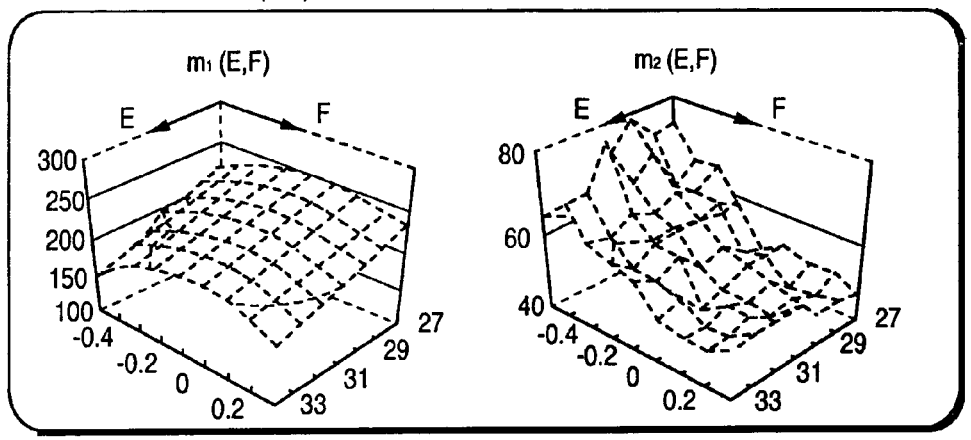
FIG.8C
MODEL DATA $M_k(E,F)$
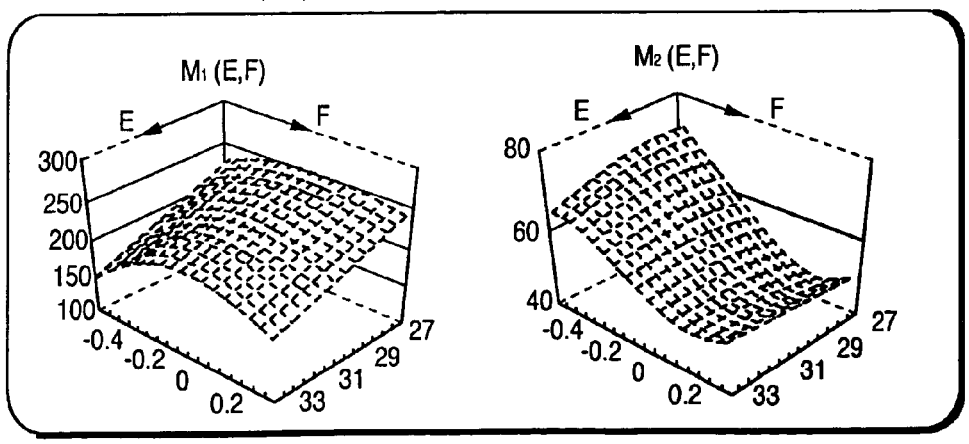

FIG.9A
APPLICATION OF FEATURE QUANTITY $f_k$
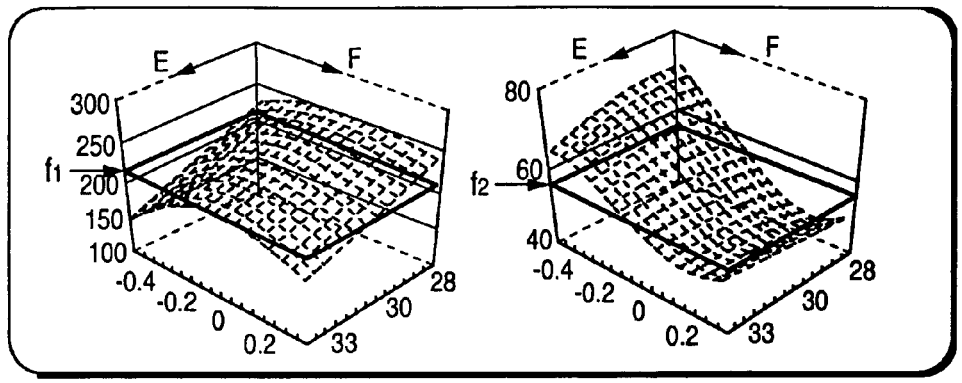
FIG.9B
LIKELIHOOD FUNCTION
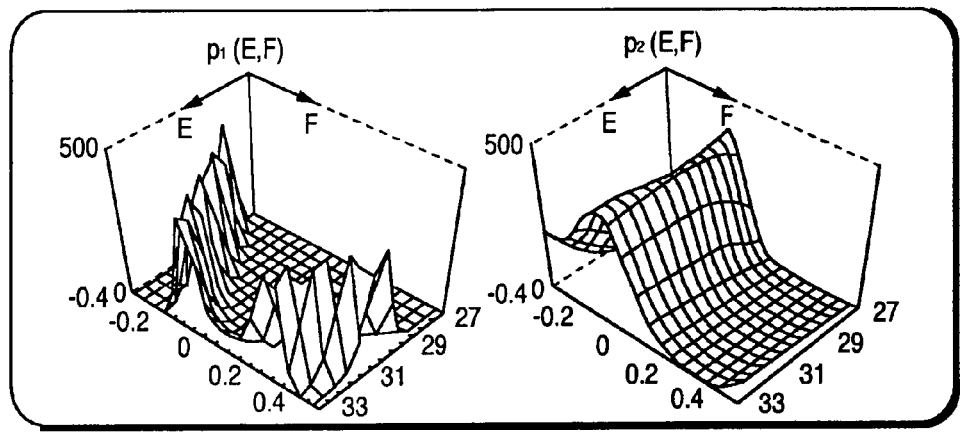
FIG.9C
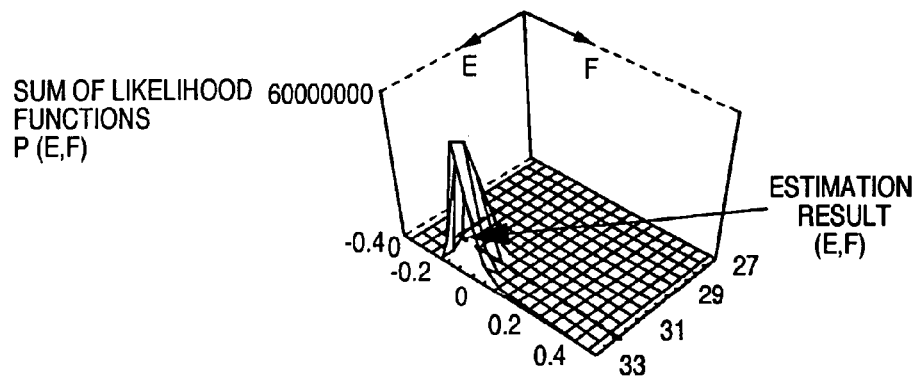

203
INPUT IMAGE

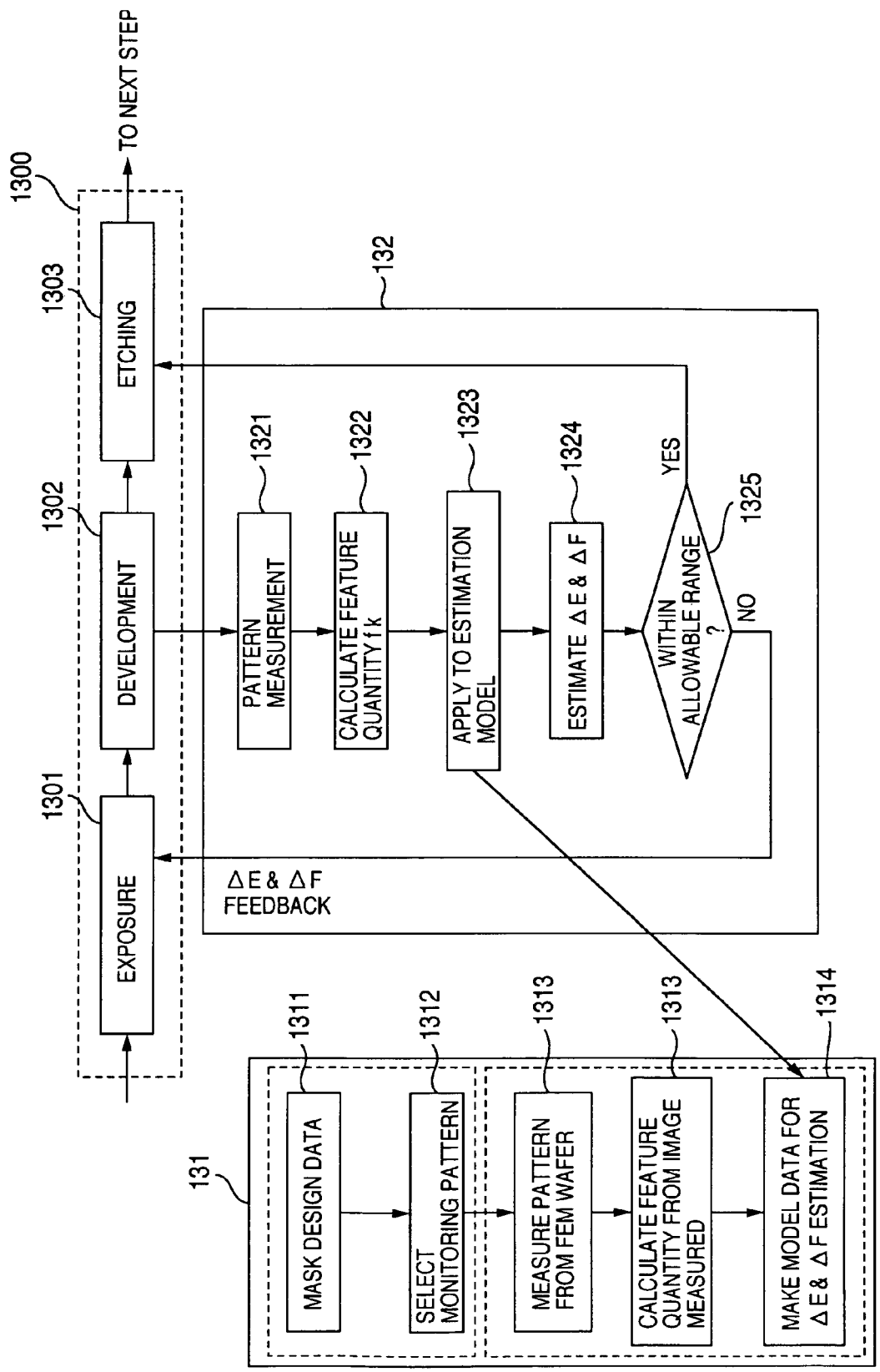

DIFFERENCE OF LIGHT INTENSITY DISTRIBUTION DUE TO DIFFERENCE IN
PITCH WIDTH (300nm, 500nm) OF LEVINSON PHASE SHIFT MASK

METHOD AND APPARATUS FOR MONITORING EXPOSURE PROCESS

INCORPORATION BY REFERENCE

The present application claims priority from Japanese application JP2004-097562 filed on Mar. 30, 2004, the content of which is hereby incorporated by reference into this application.

BACKGROUND OF THE INVENTION

The present invention relates to methodology of monitoring the state of an exposure process step in the manufacture of a semiconductor device. More particularly, but not exclusively, this invention relates to a method and apparatus for monitoring an exposure process state by measurement of the shape of a resist pattern that is formed through exposure.

FIG. 2 shows a flow of a prior known lithography process. A resist pattern is formed on or above a substrate, such as a semiconductor wafer, by depositing a resist film made of photo-sensitive material to a predetermined thickness, then using an exposure machine to perform scale-down exposure of a mask pattern (at step 2050), and thereafter developing it (2051). The resist pattern thus formed is next subjected to size check by use of a scanning electron microscope (SEM) with size measurement functions, such as length-measuring SEM or CD-SEM (at step 2052). Exemplary contents of the processing in prior art length-measure SEMs are as follows: performing size measurement after having acquired an electron beam image of a region that includes certain portions that are under requirements for strict management of size accuracy; determining whether the size measured satisfies a reference or standard value (at step 2053); and, modifying or correcting, if it fails to satisfy, the exposure amount of exposure machine (at step 2054, where an exposure correction amount is given as ΔE). For example, in the case of a positive resist, if the resist size is found to be too large, then increase the exposure amount; if too small then reduce the exposure amount. In many cases, such increment or decrement of the exposure amount is determined based on an operator's own experience and feelings.

FIG. 3 shows a typical relationship of a resist pattern and a film pattern after etching (quoted from a research paper of 98th Meeting of the 132nd Committee for Industrial Application of Charged Particle Beams by Japan Society for the Promotion of Science (JSPS), titled "Electron Beam Testing Handbook" at p. 255). Generally, the shape of the resist pattern and the shape of the etched film pattern exhibit a constant relationship as far as the etching conditions are the same. In order to obtain the intended film pattern with a predefined shape, the resist pattern also is required to have a predefined shape.

In the event that production lines are built up for fabrication of a new type of semiconductor substrates, the so-called "condition setup" works are carried out prior to introduction of product wafers. These works are for finding out the exact focussing position and proper exposure amount with which a predetermined resist pattern shape is obtainable through the steps of, for example, making pattern-printed wafers while varying a focussing position and an exposure amount on a per-shot basis (i.e., per exposure unit)—generally, such wafers are called the focus and exposure matrix (FEM) wafers—and then performing size measurement of a resist pattern of each shot, followed by the steps of cutting a wafer into portions and analyzing their cross-sectional shapes.

By this work operation, the optimal exposure amount and the optimum focusing position are determined. Then, exposure of product wafers is performed based on such the conditions. However, various process variations can take place over time. Examples of the process variations include, but not limited to, a drift of several types of sensors in an exposure machine, a change in resist photosensitivity, and a change in post exposure bake (PEB) temperature. These unwanted variations would in some cases result in the lack of an ability to obtain any intended resist pattern with an appropriate shape under the conditions determined by the condition setup works. Detecting this is an important role of the above-noted size measurement (at step 2052 of FIG. 2). In the prior art, attempts have been made to compensate for such process variability by modification or amendment of the exposure amount while regarding the size as a barometer of process variations.

It is noted that JP-A-2003-173948 discloses therein a technique for estimating a deviation amount from the proper criteria of an exposure process to be monitored, by using feature quantity obtainable from an acquired secondary electron signal to thereby create model data for correlating exposure conditions with a SEM image, and also by comparing the feature quantity obtainable from the secondary electron signal to the model data stated above.

In the prior art, in order to detect a process variation and then take necessary corrective action, a method is employed for using a length-measuring SEM to examine more than one size value such as a line width or the like and for correcting the exposure amount if the size value fails to satisfy a reference value.

In recent years, the pattern scaling has much progressed resulting in an increase in integration density of semiconductor devices. As semiconductor patterns shrink, ultra-high image resolution techniques using advanced masks such as Levinson phase shift masks are more widely used in currently established semiconductor fabrication processes. This results in a drastic decrease in allowable variability of the exposure amount and focus position. Today, it is difficult to maintain the process of interest within a proper range by mere use of the exposure correction technique. For example, it is required to control the process parameters in a way which follows: for 65-nm nodes, the permissible variability of the exposure amount falls within a range of 8 to 10% or less while letting the allowable variability of the focus position be about 200 to 300 nanometers (nm) or less. To achieve this, a need is felt to provide the information that quantitatively indicates process variations—that is, accurate quantization of variations to exactly specify the degree of a deviation of the exposure amount in the unit of millijoule (mJ) and also the degree of an offset of the focus position in unit of nm.

The above-noted prior art suffers from a risk that a variation of the focusing position can be overlooked (because such focus position variation does not always accompany with size variations). Another risk faced with the prior art lies in the inaccuracy of detection of a deviation of the exposure amount (because size variations can occur due to focus position offset also). Furthermore, it is apparent that even in cases where the focus position should be amended, any resist pattern with the proper shape is not obtainable in some cases because of the execution of such exposure amendment. Thus, it is unlikely that the prior art achieves appropriate maintenance of exposure process.

SUMMARY OF THE INVENTION

The present invention provides a method and apparatus for monitoring an exposure process, which are capable of maintaining an appropriate exposure process. In particular, this invention provides an exposure process monitoring method and apparatus capable of measuring not only a variation of the exposure amount but also an accurate variation amount of the focusing position.

In addition, the invention also provides an exposure process monitoring method and apparatus for enabling achievement of process monitoring during exposure using a Levinson phase shift mask, which is expected to become the mainstream of ultrahigh resolution exposure technologies in near future.

More specifically, the invention provides a technique for monitoring an exposure process through the steps which follow.

[Step 1]: Acquire in advance an image due to a length-measuring SEM (SEM image) of a resist pattern that is suitable for the exposure process monitoring under various exposure conditions.

[Step 2]: Use more than one feature quantity obtainable from a secondary electron signal thus acquired to thereby create model data for correlating the exposure conditions with the SEM image.

[Step 3]: Obtain the SEM image of a resist pattern that was formed through an exposure process to be monitored.

[Step 4]: Compare the feature quantity obtained from the secondary electron signal with the model data to thereby estimate or presume the amount of a deviation from the proper criteria of the to-be-monitored exposure process.

For use as the pattern to be monitored, there are employed a first line-and-space pattern (line/space pattern) which has a predetermined pitch width and line width as formed using a Levinson phase shift mask 3000 such as shown in FIG. 6 and a second line/space pattern which has its pitch width and line width that are different from those of the first pattern. The first line/space pattern as used herein is a pattern having a pitch width and line width values which are such that when the focusing position of an exposure machine varies toward the minus direction, the resist's cross-sectional shape or "profile" changes to have a forward taper shape (sidewall tilt angle $\theta<90°$); when the focus position varies to the plus direction, the resist profile changes to have a reverse taper shape (sidewall angle $\theta>90°$). The second line/space pattern is a pattern having its pitch width and line width values which are as follows: when the focus position of the exposure machine varies toward the minus direction, the resist profile changes to have the reverse taper shape; when the focus position varies to the plus direction, the profile changes into the forward taper shape.

In the Step 1 and Step 3, measurement is done by an electron microscope while combining together the above-noted patterns to thereby detect a deviation amount of the focus position without regard to the sign (plus or minus) of the focus position. The feature quantity used for the estimation of such deviation amount from the proper criteria of the to-be-monitored exposure process may include a size feature quantity containing the edge width and/or pattern width of a secondary electron image of a resist pattern that was sensed by the electron microscope, the magnitude or strength of a secondary electron signal of the resist pattern, the waveform of a secondary electron signal of the resist pattern, and/or a secondary electron image of the resist pattern.

In accordance with this invention, it becomes possible to measure an accurate variation amount of the focusing position as well as a variation of the exposure amount. This makes it possible to maintain the proper exposure process.

In addition, according to the invention, it becomes possible to monitor the exposure process using the Levinson phase shift mask, which is expected to become the mainstream of ultrahigh resolution exposure technologies.

These and other objects, features and advantages of the invention will be apparent from the following more particular description of preferred embodiments of the invention, as illustrated in the accompanying drawings.

BRIEF DESCRIPTION OF THE DRAWINGS

FIG. 2 is a flow diagram showing a prior known lithography process.

FIG. 8A is a plan view of an FEM wafer, FIG. 8B is a three-dimensional (3D) graph of original data $m_k(E, F)$, and FIG. 8C is a 3D graph of model data $M_k(E,F)$.

FIG. 9A is a 3D graph showing application of a feature quantity $f_k$, FIG. 9B is a 3D graph showing a likelihood function $p_k(E,F)$, and FIG. 9C is a 3D graph showing a product $P(E,F)$ of the likelihood function.

FIG. 12 is a flow diagram showing the processing flow of a method for selection of an appropriate combination of measurement patterns suitably adaptable for exposure monitoring.

DESCRIPTION OF THE EMBODIMENTS

Currently preferred embodiments of the present invention will be explained with reference to the accompanying drawings below.

(1) Overall Process Flow of Embodiment

Figure 4:
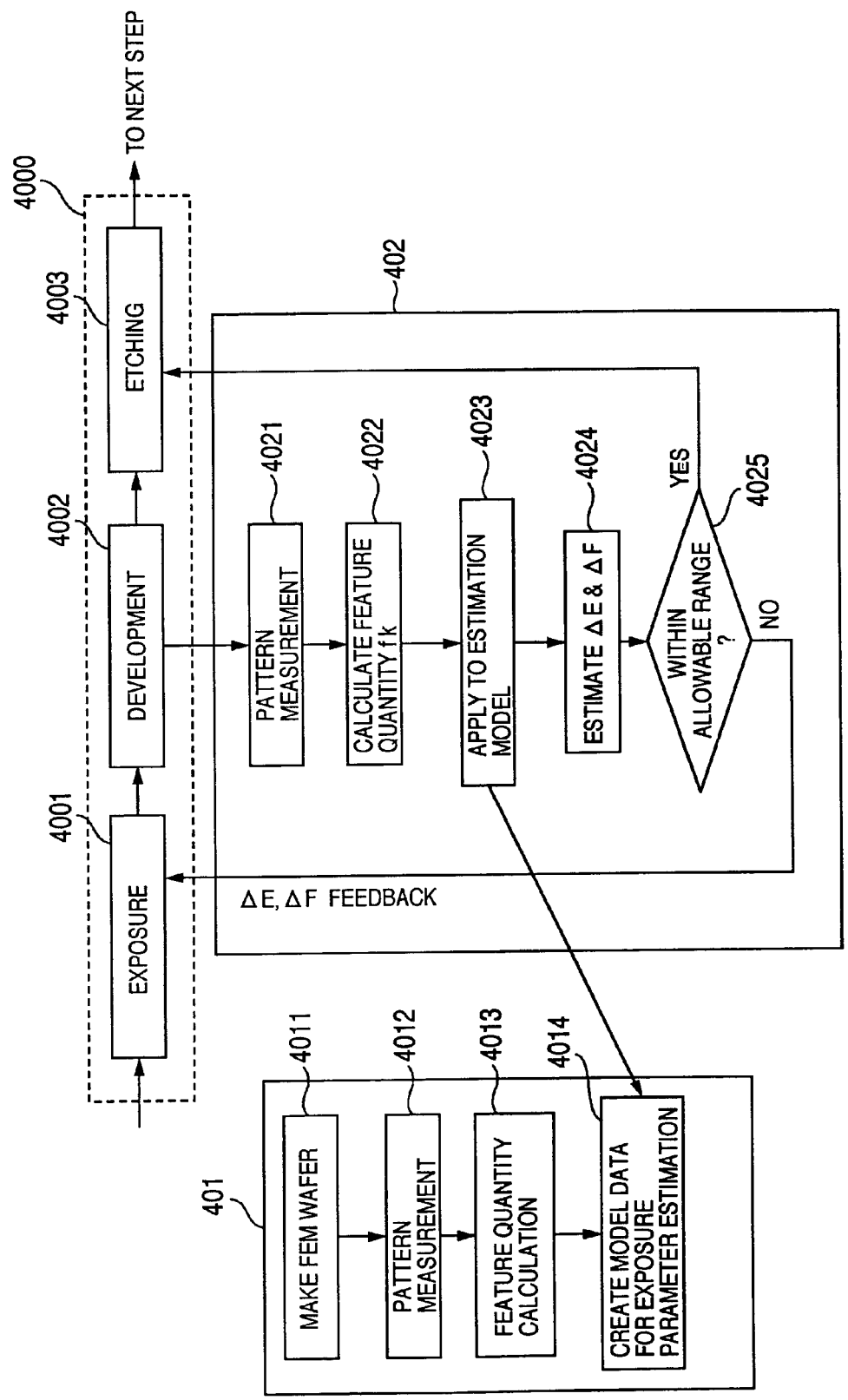
FIG. 4 is a flow diagram showing the flow of an entire processing of an exposure process monitoring method embodying the invention.

FIG. 4 is a conceptual diagram of an exposure process monitor in a lithography process in accordance with one embodiment of this invention. In FIG. 4, a part 4000 surrounded by broken lines shows a process flow of product wafers (this process progresses in a left-to-right fashion), while portions 401 and 402 surrounded by solid lines indicate processing procedures for exposure condition monitoring, as established on a length-measuring scanning electron microscope (SEM). The portion 401 shows the flow of a processing for pre-creating a set of model data used for estimation or presumption of an exposure amount and a focusing position (it progresses downwardly). The portion 402 indicates the flow of an exposure process monitoring processing, which includes the step of detecting an exposure amount and a focus position from a wafer that was developed at block 4002 to thereby realize the monitoring of exposure conditions.

This exposure process monitor includes the steps of sensing a predetermined resist pattern to be later described by a scanning electron microscope with size measurability (referred to as length-measuring SEM hereinafter) to thereby acquire a SEM image, and calculating through computation more than one feature quantity $f_k$ from this SEM image of the predetermined resist pattern. Note here that the suffix "k" is a serial number of feature quantities (k=1, 2, . . . , n, where "n" is a total number of the feature quantities). Next, apply the feature quantity $f_k$ to the model data $M_k(E,F)$ which correlates exposure conditions (E,F) with observation data; then, from the application results of all feature quantities, calculate the exposure conditions (E,F). Note here that the model data $M_k(E,F)$ is pre-created by collection of observation data under various exposure conditions (E,F) while using the FEM wafer stated supra.

The calculation result of (E,F) is sent to a semiconductor fabrication control system including an APC controller that performs process control. Then, based on transition with time of variations of the exposure amount and the focusing position, determine certain values ΔE and ΔF that are fed back to an exposure machine. These feedback amounts ΔE and ΔF are used to modify or update the exposure machine's recipe at a later stage. As a result, the wafer (lot) is thereafter expected to experience exposure under better process conditions. In this invention, even when any one of the focus position and the exposure amount deviates, it becomes possible to maintain a normal exposure process because such variation is quantitatively measured on a real time basis and then fed back to the exposure conditions. Below is a detailed explanation of the invention.

(2) Measured Patterns

Figure 6:
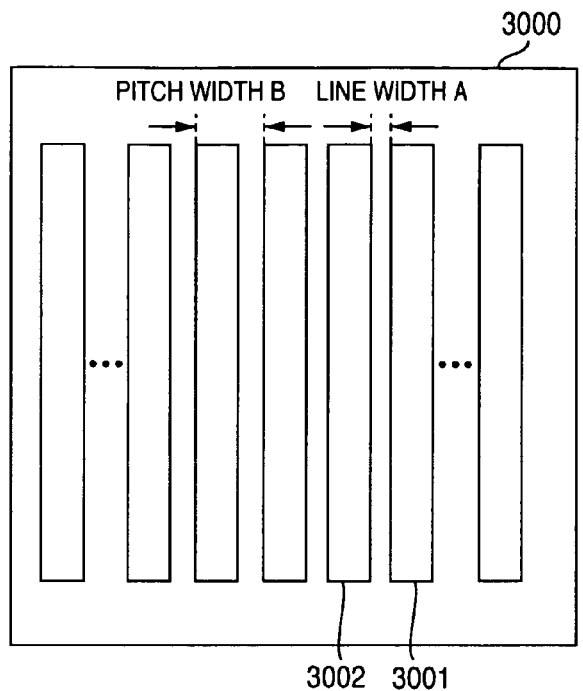
FIG. 6 is a plan view of a mask structure of a Levinson phase shift mask.

Here, an explanation will be given of patterns suitable for SEM measurement at the "pattern measurement" step 4021 of FIG. 4 in the event that the process monitor is realized in an exposure process using the Levinson phase shift mask 3000 that comprises a phase shifter 3001 with its phase of 0° and a phase shifter 3002 with a phase of 180° as shown in FIG. 6.

In view of the fact that the observation of a resist pattern on or above a developed wafer is performed by the length-measure SEM as stated previously, the resist pattern observation includes the steps of vertically irradiating an electron beam onto the resist pattern from its upper side and then observing an electron beam image (referred to hereinafter as "top-down image") which was obtained by detection of secondary electrons thus generated.

Figure 14A:
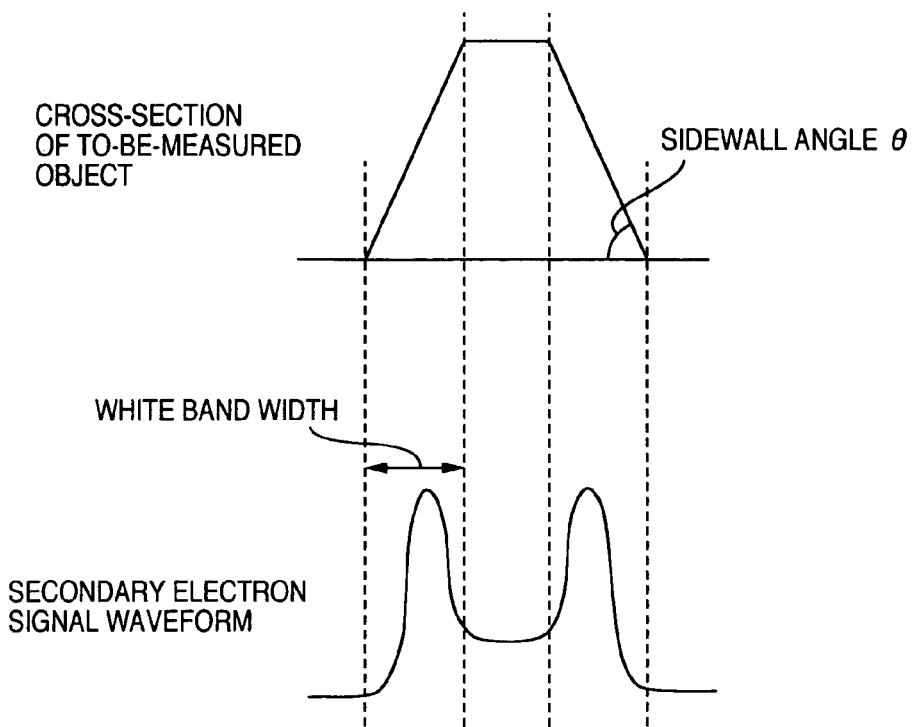
FIG. 14A is a waveform diagram showing the relationship of a line pattern profile versus a secondary electron signal strength.

FIG. 14A shows the relationship of a cross-sectional shape or "profile" of a line pattern versus the magnitude or strength of a secondary electron signal. Generally, the secondary electron signal strength increases with an increase in tilt angle θ of resist sidewall. Thus, the signal strength at such sidewall is greater than that at a flat portion. The secondary electron signal from this sidewall is observable as a bright band-like portion on an electron beam image so that it is called the "white band" or "bright band" in some cases.

Figure 14B:
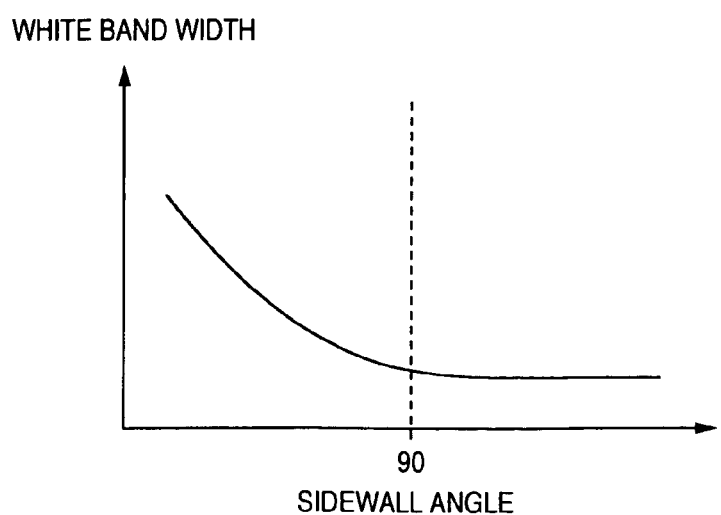
FIG. 14B is a graph showing the relation of a sidewall tilt angle and a white band width.

See FIG. 14B, which pictorially shows the relationship of a widewall tilt angle and a white band width. In a region with the tilt angle θ being more than or equal to 90°, the white band width is no longer changeable. This is true because no changes appear on the top-down image when the sidewall becomes reverse tapered. Consequently, the capability to catch from the observed image a change in resist profile occurring due to variations of the exposure machine's exposure amount and focusing position by using the characteristics indicative of the tendency of the resist profile, such as the while band, is limited and available only when the profile is presently forward tapered.

Figure 1A:
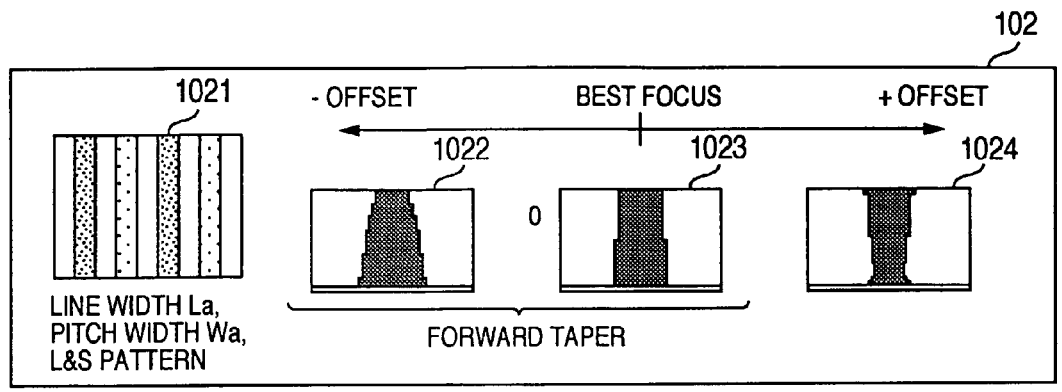
FIG. 1A is a diagram showing a plan view of a line-and-space pattern for observation, which is relatively less in pattern pitch width; and, FIG. 1B shows a plan view of a line/space observation pattern that is relatively large in pattern pitch width.
Figure 1B:
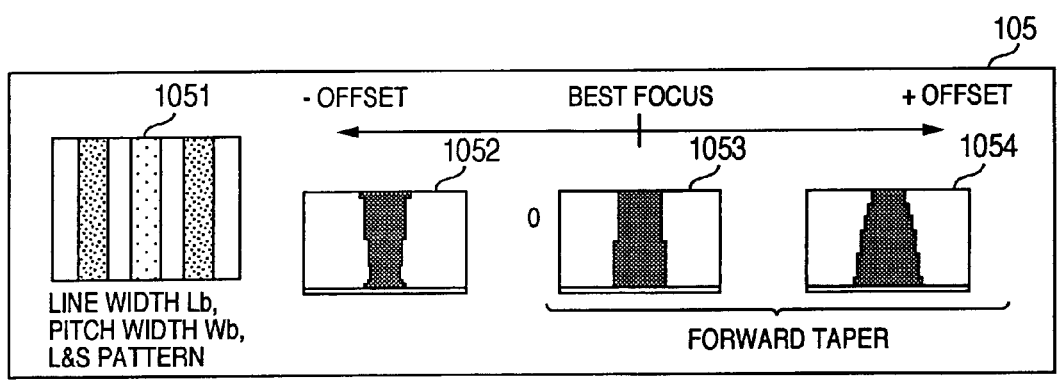
Figure 3:
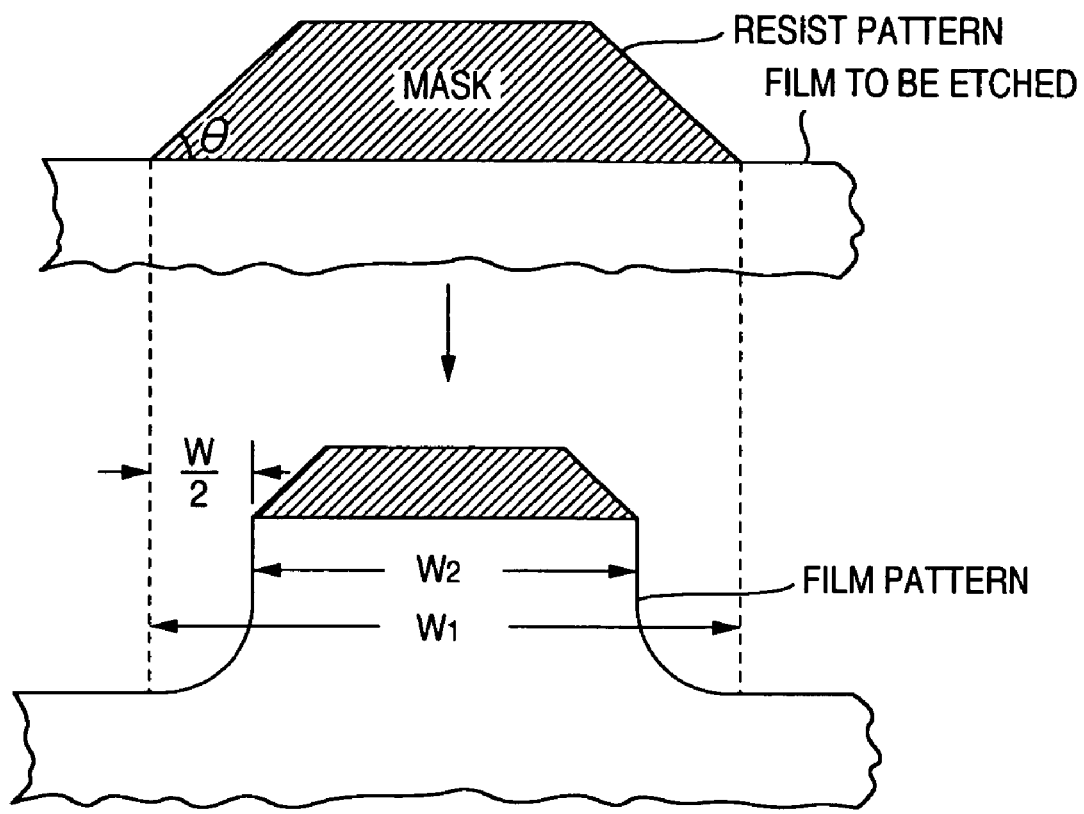
FIG. 3 is a cross-sectional diagram showing the relationship of a resist pattern shape versus a film pattern shape.

To satisfy the above-noted conditions, two types of patterns are used as the observation pattern: a line-and-space pattern 1021 which is relatively less in pattern pitch width such as indicated by numeral 102 in FIG. 1A, and a line/space pattern 1051 that is relatively large in pattern pitch width such as shown by 105 in FIG. 1B (practical examples of the pattern pitch width and line width conditions will be discussed later). As shown in FIG. 1A, the pattern 1021 (having a line width La and a pitch width Wa) is such that the resist profile 1022 becomes a forward tapered shape (sidewall tilt angle θ<90°) when the focus position is deviated or offset toward the minus (−) direction of the exposure machine with respect to its best focus position 1023 (i.e., minus-defocused; when the focus position is offset to the plus (+) direction namely, plus-defocused the resist profile 1024 becomes a reverse tapered shape (sidewall angle θ>90°). Adversely, as shown in FIG. 1B, the pattern 1051 (having its line width Lb and pitch width Wb) is as follows: the resist profile 1052 becomes reverse tapered when the focus position is minus-defocused with respect to the best focus position 1053; when the focus is plus-defocused, the resist profile 1054 becomes forward tapered. Such behavior difference takes place due to the fact that the effective light intensity distribution differs depending on the line width and pitch width used.

Figure 15:
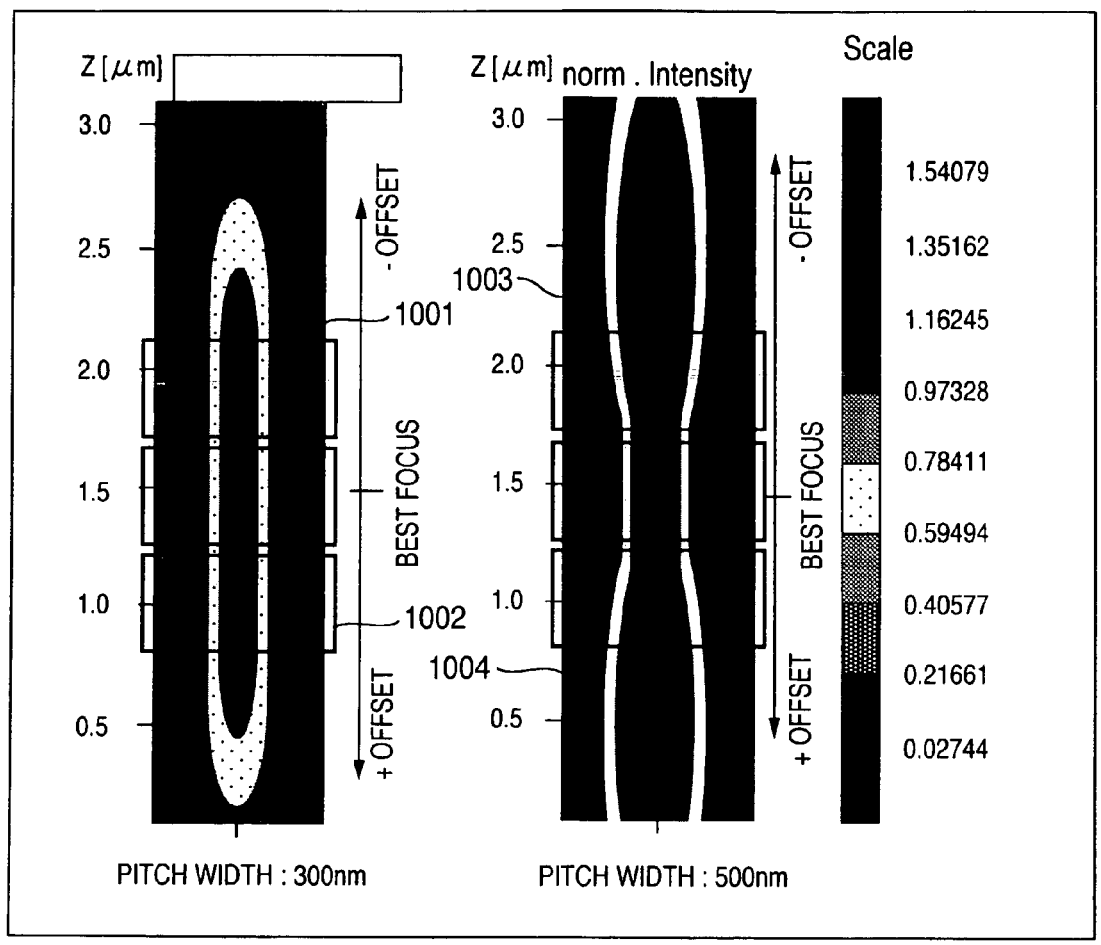
FIG. 15 is a diagram showing simulation results of a light intensity distribution during exposure using the Levinson phase shift mask.

Simulation results of the light intensity distribution are shown in FIG. 15. This diagram shows side-by-side a couple of light intensity distributions when the pitch width values are set at 300 nm and 500 nm respectively while letting the line width be the same (120 nm). Apparently, the more the light intensity, the higher the resist dissolvability. Thus it can be seen that when the pitch width is set at 300 nm, the resist profile becomes forward tapered (1001) in the minus-defocus event and also that the profile becomes reverse tapered (1002) in the plus-defocus event. By contrast, it is understandable that with the setting of the pitch width at 500 nm, the resist profile becomes reverse tapered in the minus-defocus event (1003) and that it becomes forward tapered (1004) in the plus-defocus event.

Figure 16:
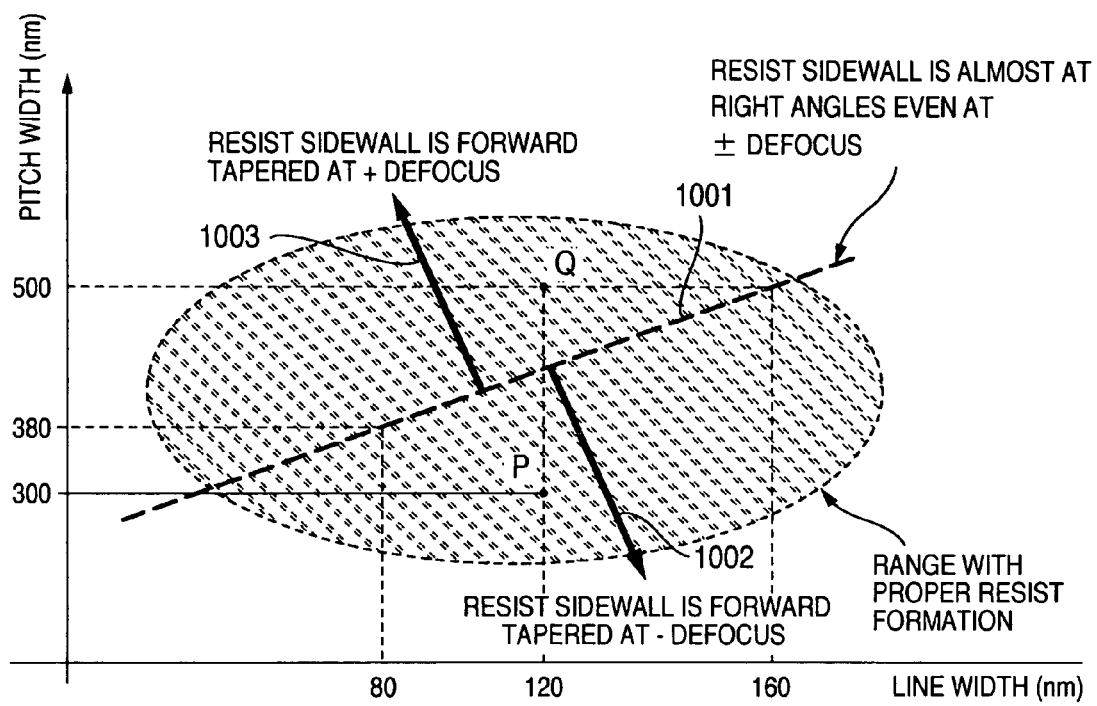
FIG. 16 is a graph showing differences in resist profile to be formed depending upon the pitch width and line width.

One example of the pitch width versus line width relationship suitable for the observation pattern is shown in FIG. 16.

This example is the case where exposure of circular illumination is performed while letting the exposure wavelength be set at 193 nm and the resist film thickness at 300 nm. The lateral axis of this graph indicates the line width, whereas its vertical axis denotes the pitch width. An upper region above a broken line shows the behavior that the resist profile becomes forward tapered upon occurrence of the plus-defocusing as shown in FIG. 1B; a lower region beneath the broken line indicates the behavior that the resist profile becomes forward tapered upon occurrence of the minus-defocus as shown in FIG. 1A. As previously described, the capability to catch from the observation image of a change in resist profile the behavior of the exposure machine's exposure amount and focusing position is limited and available only in case the resist profile is forward tapered. In view of this fact, it becomes possible, by selecting a to-be-measured pattern from the upper range 1003 overlying the broken line 1001 and the lower range 1002 on the lower side thereof, to detect the exact focus position in a way irrespective of whether a presently irradiated beam is plus-defocused or minus-defocused.

Practical examples of the combination of those patterns different in pitch width and line width from each other are as follows. It was ascertained by exposure simulation that in the case of the previously stated exposure conditions shown in FIG. 16 (circular illumination with the exposure wavelength of 193 nm and resist film thickness of 300 nm), it is recommendable, when the line width is 120 nm, to combine together a pattern having its pitch width ranging from 200 to 350 nm (for example, a point P of FIG. 16 with a pitch width of 300 nm) and a pattern having its line width of 120 nm and pitch width of 450 to 600 nm (e.g., point Q of FIG. 16 with a pitch width of 500 nm). The former pattern (point P of FIG. 16) indicates the behavior of FIG. 1A, whereas the latter (point Q of FIG. 16) shows the behavior of FIG. 1B.

(3) Configuration of Length-Measuring SEM Used in Embodiment

Here, there will be described a configuration of a length-measuring SEM used for the monitoring of variations in exposure conditions and those devices operatively associated therewith.

Figure 5:
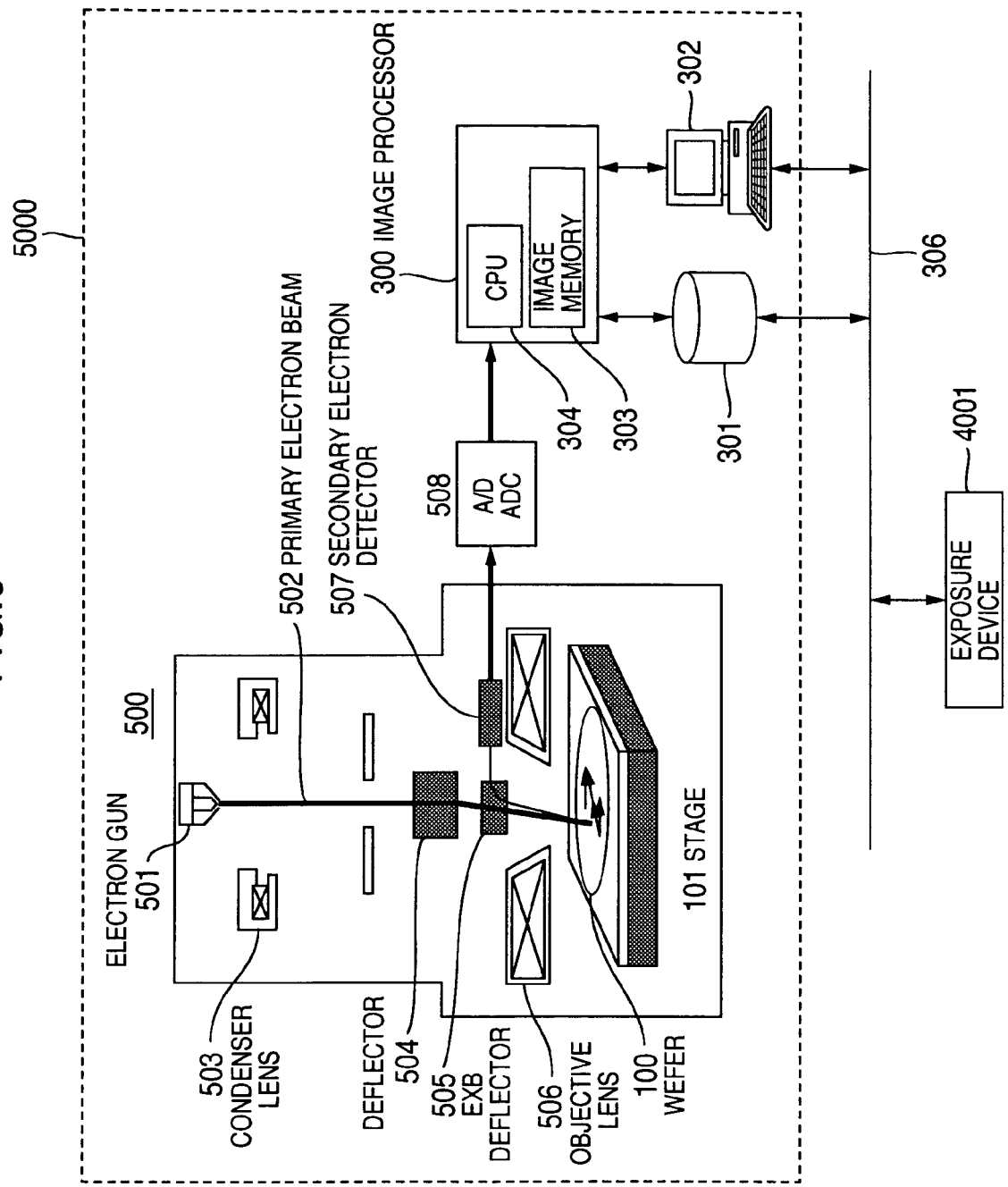
FIG. 5 is a block diagram showing an overall configuration of an apparatus for use with the exposure process monitoring method.

FIG. 5 is a block diagram showing a configuration of the length-measure SEM, wherein a part surrounded by doted line 5000 is a major component of an exposure process monitoring system, which is established on the length-measure SEM 500. In FIG. 5, a primary electron beam 502 that is emitted from an electron gun assembly 501 of the length-measure SEM 500 travels through a beam deflector 504 and an E×B deflector 505 plus an objective lens 506 to fall onto a wafer 100 (including a liquid crystal substrate) being put on a stage 101 so that the beam is focused on the wafer. Upon irradiation of the electron beam, secondary electrons are produced from the wafer 100, which is a test sample or specimen. The secondary electrons generated from the wafer 100 are deflected by the E×B deflector 505 and then detected by a secondary electron detector 507. Then, either two-dimensional (2D) scanning of electron beam or repeated scanning of the electron beam in X direction is performed by the defelctor 504, followed by detection of those electrons that are produced from the specimen in synchronism with the wafer's continuous movement in Y direction. Whereby, a 2D electron beam image is obtained. An analog signal that was detected by the secondary electron detector 507 is converted by an analog-to-digital converter (ADC) 508 into a corresponding digital signal, which is then sent forth toward an image processing unit 300.

The image processor unit 300 has an image memory 303 for temporarily storing therein digital image data and a central processor unit (CPU) 304 for performing calculation or computation of more then one size feature quantity from the image data being stored in the image memory. The image processor 300 further includes a storage unit 301 which describes a model for correlating the size feature quantity with a pre-analyzed set of exposure conditions. The image processor 300 is connected to a workstation 302 which provides overall controls, thereby enabling achievement of an operation of a necessary device and confirmation of a detection result by way of a graphical user interface (GUI). In addition, the storage unit 301 and workstation 302 are linked to an external network 306 to thereby make it possible to send and receive data to and from external equipment via the network. An external display device 305 that exists on the network is operable to visually display, on its screen, a current state or circumstance of the process control being presently performed by APC controller (not shown), examples of which are the present state of an exposure device, a revision description of the recipe of the exposure device, and a process control plan. Additionally, based on the amount of a deviation of the to-be-monitored exposure process from pertinent proper conditions, which amount is estimated by the exposure process monitoring method, a correction value of the exposure conditions is fed back via the network 306 to the exposure device 401 to thereby perform the exposure process control.

(4) Feature Quantity used for Exposure/Focusing Estimation (Part 1)

Here, an explanation will be given of the feature quantities suitable for the exposure process monitor to be calculated at the "feature quantity calculation" step 4022 of FIG. 4.

Figure 7:
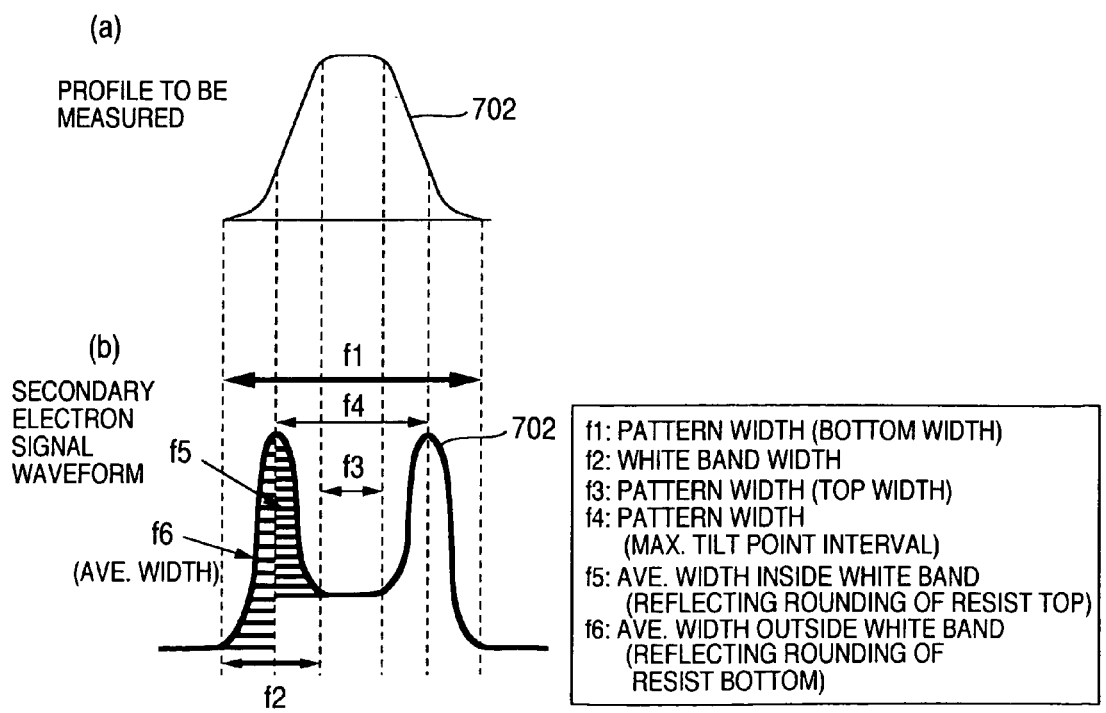
FIG. 7 is a diagram showing, at its part "a," a cross-sectional shape of a resist while showing at part "b" a relationship relative to each feature quantity to be calculated from a secondary electron signal waveform.

FIG. 7 shows the relationship of a cross-sectional shape or "profile" 701 of line pattern versus a secondary electron signal magnitude or strength 702 that is obtainable by observation using the length-measure SEM. In general, the secondary electron signal strength increases with an increase in tilt angle so that a signal strength at a sidewall portion becomes greater than that at a flat portion. The feature quantities indicative of a change in resist profile may typically include various kinds of characteristic values as indicated relating to the secondary electron signal waveform in FIG. 7. Using these makes it possible to accurately catch a change in resist profile. The pattern's bottom width f1 indicates the tendency of a width at a root portion of line profile. The pattern's top width f2 denotes width tendency at a top portion of the line profile. An average width f5 inside a white band reflects the rounding of the top portion of line profile, whereas an average value f6 outside the white band reflects the rounding of the root portion of line profile.

As apparent from the foregoing, at the "feature quantity calculation" step 4022 of FIG. 4, it becomes possible, by calculation of a plurality of feature quantities from the secondary electron signal waveform, to catch in detail the tendency of shape changes of the resist profile.

(5) Exposure/Focus-Position Calculation Method

Here, an explanation will be given of a presumption method at the "application to estimation model" step 4023 of FIG. 4.

A model creation procedure is shown in FIGS. 8A to 8C. As shown in FIG. 8A, use an FEM wafer to acquire images at respective sets of exposure amount and focusing position (E, F) (at "pattern measurement" step 4012 in FIG. 4). Then, calculate from a projection waveform of each image more than one feature quantity for use as a parameter indicative of a resist profile change (at the "feature quantity calculation from the pattern" step 4013 in FIG. 4). More specifically, calculate the feature quantities such as indicated by f1 to f6 in FIG. 7 in the way described previously. Let this be original data mk(E,F), where k=1, 2, . . . , n, and n is a total number of feature quantities (see FIG. 8B). By applying thereto smoothing and interpolation, create the model data Mk$_k$(E,F) shown in FIG. 8C (at "exposure Parameter Estimation Model Creation" step of FIG. 4). The interpolation is done here in order to calculate the exposure amount and focus position with a higher degree of resolution than intervals of the FEM's exposure and focus position.

A procedure of calculating the exposure amount and focus position is shown in FIGS. 9A-9C. Calculate feature quantities fk (k=1, 2, . . . , n) from the SEM image of the resist pattern of a wafer for which the exposure/focus position presumption is to be done (FIG. 9A). Then, under an assumption that a variation of feature quantity $f_k$ complies with the normal distribution of standard deviation δk, obtain a likelihood function $p_k$(E,F) (where, k=1, 2, . . . , n) shown in Equation (1) below (FIG. 9B).

$$p_k(E, F) = \frac{1}{\sqrt{2\pi}} \exp\left\{\frac{(f_k - M_k(E, F))^2}{2\sigma_k}\right\} \quad (1)$$

The standard deviation δk is set at an appropriate value according to actual conditions of a process variation of the feature quantities $f_k$. Consequently, as shown in FIG. 9C, the likelihood functions thus obtained in units of feature quantities are multiplied together to thereby obtain P(E,F) (see Equation 2 below). Then, find a specific set with its (E,F) being the maximum value among them; next, let it be a solution of the exposure/focus-position estimation (Equation 3).

$$P(E, F) = p_1(E, F) \times p_2(E, F) \ldots \times p_n(E, F) \quad (2)$$

$$(E, F) = \left\{(E_i, F_j) \mid P(E_i, F_j) = \max_{e, f} P(e, f)\right\} \quad (3)$$

With the method stated above, the intended estimation of exposure and focus position is achievable at the "application to estimation model" step 4023 of FIG. 4.

(6) Model Data Creation (Another Method)

Here, a description will be given as to a method of making model data by simulation without the use of any FEM wafer in the model data creation step 401 of FIG. 4.

Figure 17:
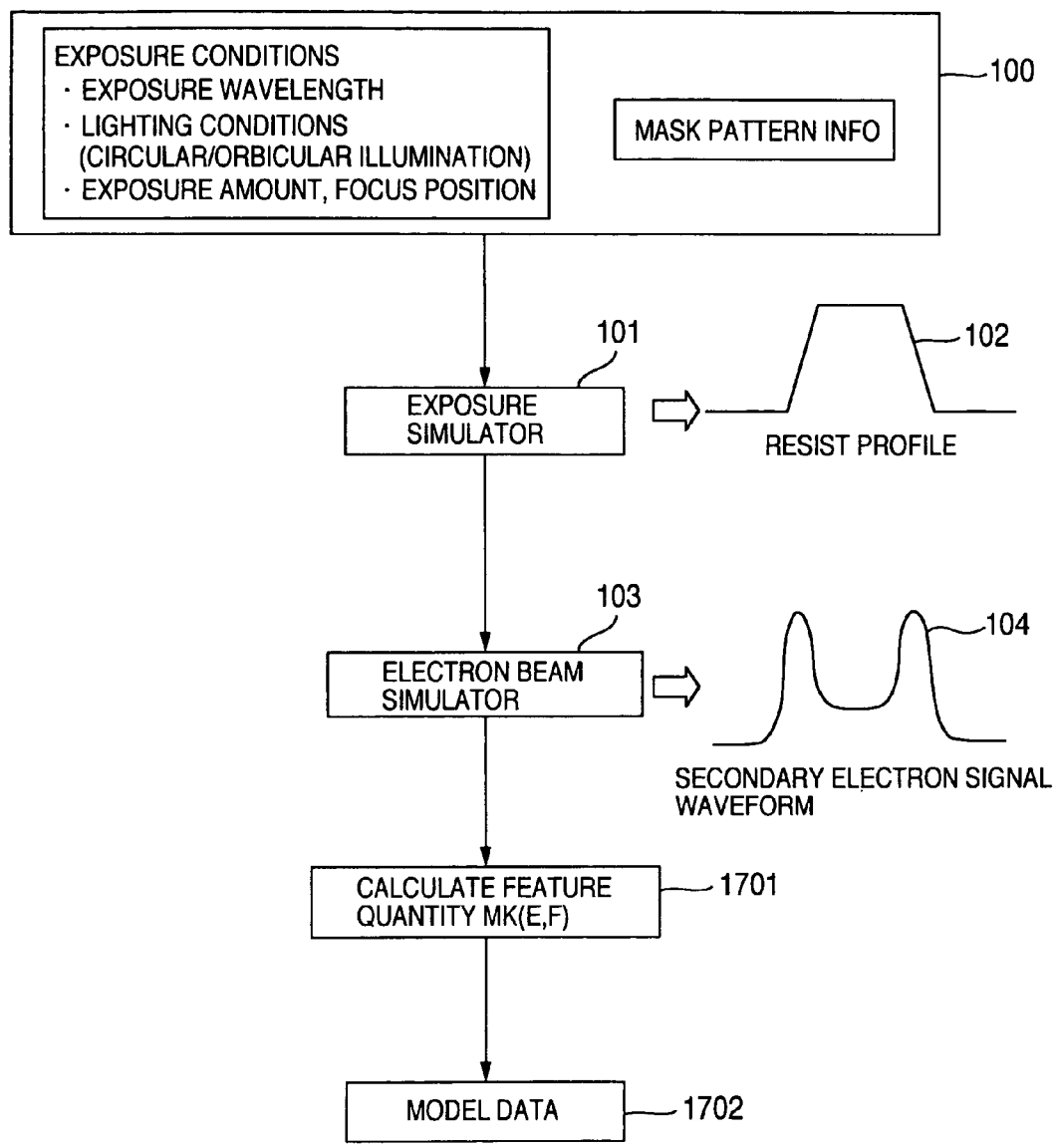
FIG. 17 is a flow diagram showing the flow of a process for creating model data from mask design data by use of an exposure simulator and an electron beam simulator.

A processing flow of it is shown in FIG. 17. Several information items 100 such as mask pattern information and exposure conditions (exposure wavelength, illumination conditions, resist film thickness, or else) are input to an exposure simulator 101. Then, perform calculations while varying the exposure amount and focusing position, to thereby calculate a resist profile 102 at the time the exposure and focus position are varied.

Next, with the calculated resist profile 102 as an input, calculate its secondary electron signal waveform 104 by an electron beam simulator 103. From the secondary electron signal waveform 104, calculate a respective one of the feature quantities shown in FIG. 7. Let this be m$_k$(E,F) (k=1, 2, . . . , n, where n is a total number of the feature quantities) at step 1701 of FIG. 17; let a smoothed and interpolated value Mk$_k$(E,F) be model data 1702. Interpolation is required in order to calculate the exposure and focus position with a higher degree of resolution than the intervals of FEM's exposure and focus position.

By creating the model data 1702 using the exposure simulator 101 and the electron beam simulator 103 in this way, it is no longer necessary to make any FEM wafer using exposure equipment for measurement by the length-measure SEM.

(7) Feature Quantity Used for Exposure/Focusing Estimation (Part 2)

Feature quantities other than those shown in FIG. 7 may be used as the feature quantities to be calculated at the "feature quantity calculation" step 4022 of FIG. 4.

Figure 10A:
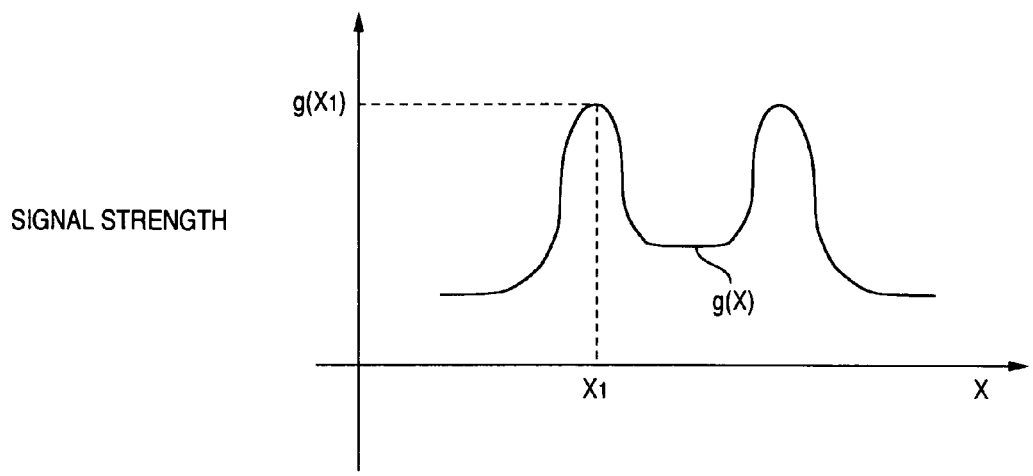
FIGS. 10A and 10B are diagrams each showing the waveform of a secondary electron signal.
Figure 10B:
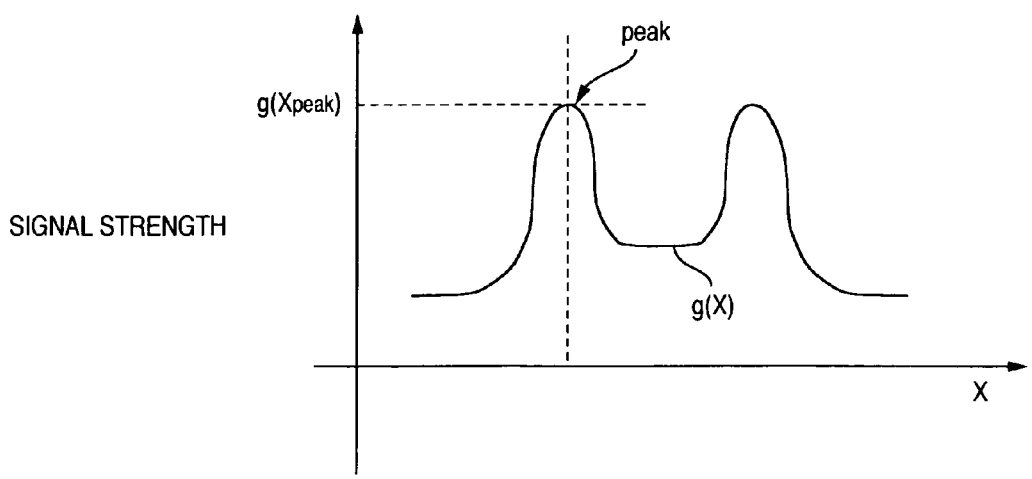

One of such feature quantities is the magnitude or strength of a secondary electron signal. As generally known, the secondary electron signal varies in accordance with the sidewall tilt angle and shape of a resist in such a manner that secondary electrons released increase in number with an increase in sidewall angle and also with an increase in sharpness of an edge of the shape (this is called the "edge effect" of secondary electrons). In view of this fact, a change in resist profile is catchable and observable depending on such signal strength. For this reason, utilize this as one of the feature quantities. As shown in FIGS. 10A-10B, when representing the strength of a secondary electron signal by g(x), specify a certain coordinate point (for example, x1 of FIG. 10A) on the signal waveform as a reference, and use a signal strength at this point as the feature quantity. Alternatively, select as the reference a characteristic point on the waveform, such as a peak position of the signal waveform or a ridge portion thereof (see FIG. 10B). In this case, a threshold method or the like is used for the signal waveform to calculate the position of a peak or ridge portion of the signal waveform and then calculate a signal strength at such portion, which will be used as a feature quantity.

Still alternatively, the secondary electron signal waveform per se is usable as one of the other feature quantities. Whereby, catch as the feature quantity the tendency of the signal waveform shape or the like, i.e., two-dimensional (2D) information of the signal waveform (coordinates and signal strength on the signal waveform). Such the signal waveform shape contains 2D information of a resist profile (tendency of a continuous shape change in the cross-section direction of the resist). Thus it is possible to more accurately catch the resist profile, so this is utilizable as one of the feature quantities required. In a case where the secondary electron signal waveform per se is used as a feature quantity, measure from an FEM wafer a length-measure SEM image of each pattern used for the presumption; then, calculate from each measured image a secondary electron signal waveform; next, let this signal waveform itself as the feature quantity.

Figure 11A:
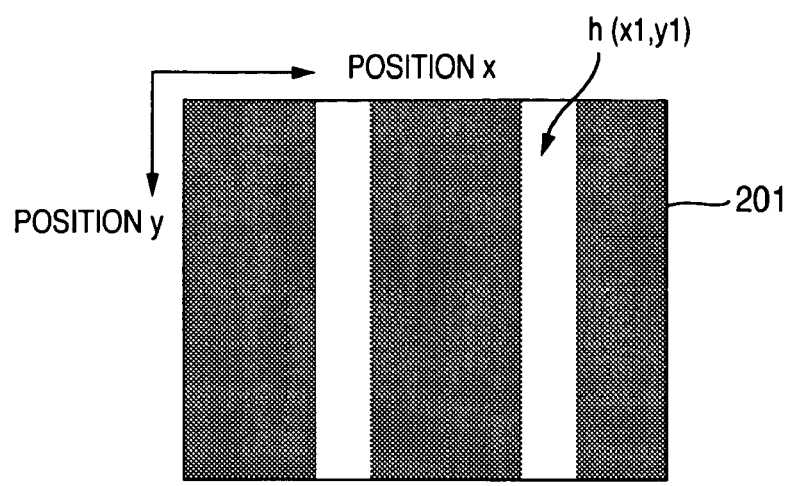
FIGS. 11A-11B are diagrams each showing an electron beam image.
Figure 11B:
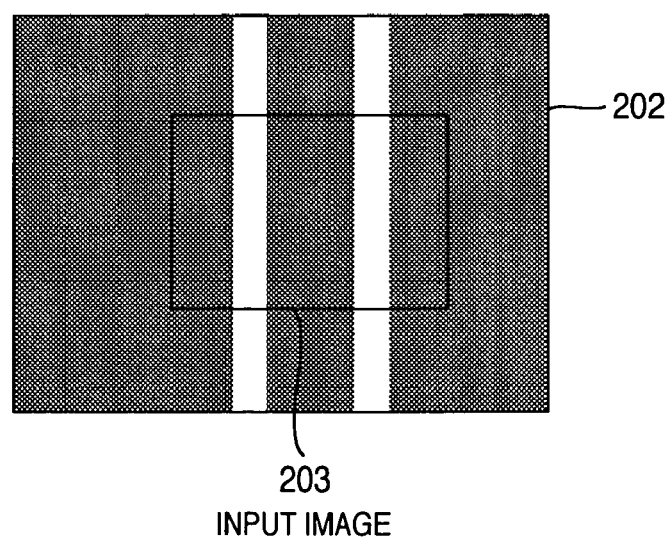

Furthermore, it is also possible use a secondary electron image as one of the other feature quantities. This makes it possible to extract the information of a resist shape in a top-down image of a pattern to be formed on or above the wafer (i.e., the tendency of a continuous shape change of the pattern overlying the wafer surface), thereby enabling more precise recognition of the resist shape. As shown in FIG. 11A, let an electron beam image h(x,y) be the feature quantity. Define a coordinate point with a specific position coordinate within the electron beam image being as a reference (see FIG. 11A, for example (x1, y1)), use a signal strength at this coordinate point as the feature quantity. Alternatively, as shown in FIG. 11B, crop a matching region 203, which contains a pattern to be measured, from the SEM image of each pattern used for the presumption from FEM wafer, then let an image of the cropped region per se be the feature quantity.

As apparent from the foregoing, it becomes possible to more precisely catch the characteristics of a resist shape, by using, as the feature quantities to be calculated at the "feature quantity calculation" step 4022 of FIG. 4, all or some of the above-noted secondary electron signal strength, secondary electron signal waveform, and secondary electron beam image in addition to those shown in FIG. 7.

(8) Method of Selecting Pattern Combination Used for Exposure Process Monitor

Here, there will be discussed a method for selecting a measurement pattern or a combination of patterns preferably used for the exposure/focus-position monitoring of an exposure machine at the "pattern measurement" step 4021 of FIG. 4.

Figure 13:
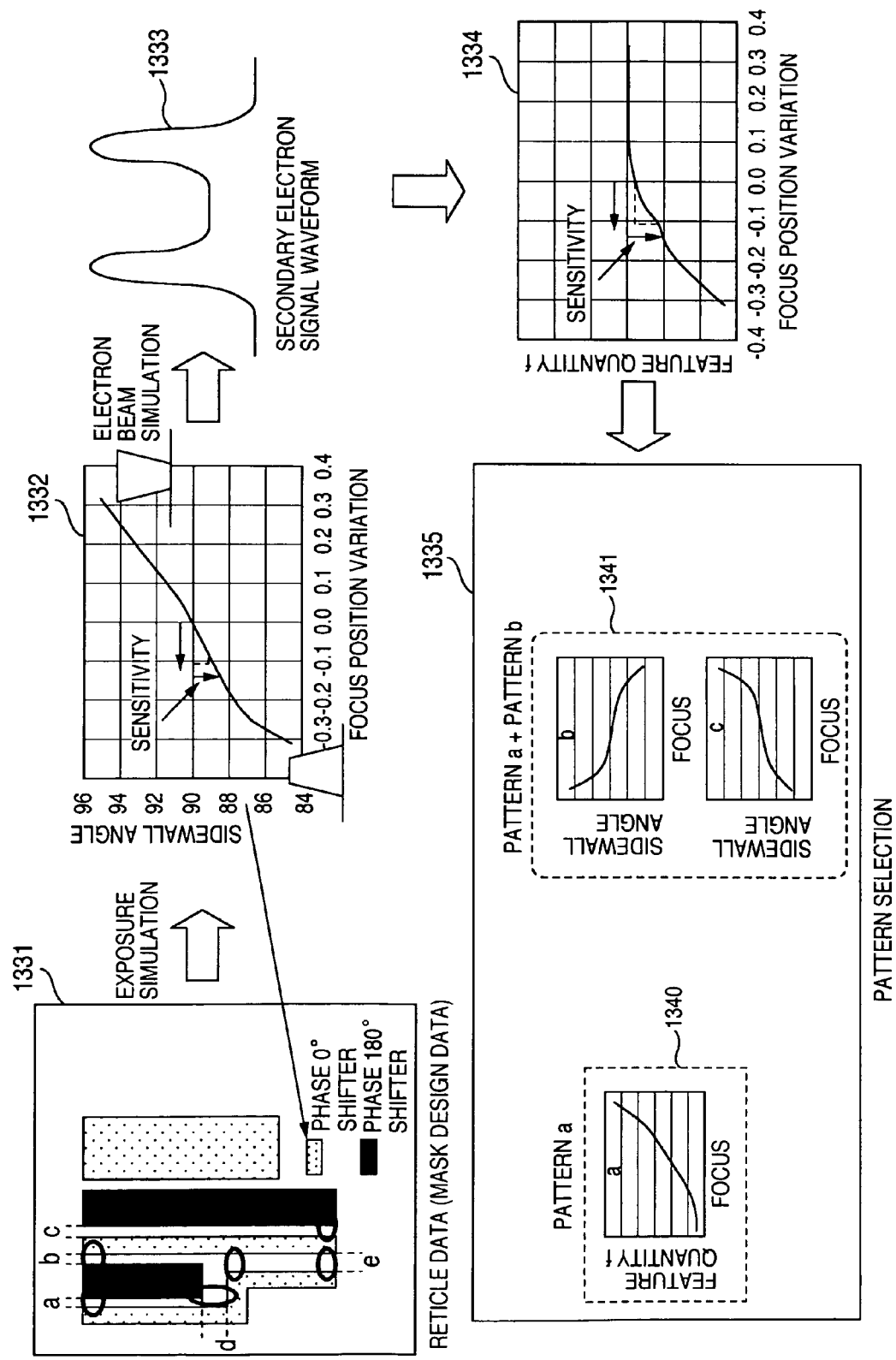
FIG. 13 is a flow diagram showing a processing flow for selection of an optimal measurement pattern combination suitable for the exposure monitoring.

A rough flow of an exposure process monitor with the method built therein is shown in FIG. 12. In addition, a conceptual diagram of a measurement pattern selecting method is shown in FIG. 13, which method is suitable for the monitoring of the exposure and focus position of the exposure machine. In FIG. 12, a processing block 132 for realizing the monitoring or "watchdog" of exposure conditions while detecting the exposure and focus position from a wafer that was subject to development is the same in principle as that explained in conjunction with the block 402 of FIG. 4, except for an "application to estimation model" block 1323, so a detailed explanation is eliminated herein. For a pattern on mask design data (1311, 1331) prior to execution of exposure, calculate by exposure simulation the sensitivity of a feature quantity with respect to changes in exposure and focus position (i.e., the significance of a change) at steps 1313 and 1332, thereby creating model data for ΔE and ΔF presumption use (at step 1314). The feature quantities as used herein may refer to the above-noted feature quantities indicated in FIG. 7 that is, some or all of the secondary electron signal strength, secondary electron signal waveform (1333) and secondary electron beam image. At this time, during selection of a monitoring pattern (at 1312, 1335), select a pattern (1340) that is great in sensitivity of feature quantity within an exposure/focus-position variation range (1334) to which process monitoring is applied, or alternatively select in combination a plurality of patterns (1341) which are large in sensitivity at part of the process monitoring-applied exposure/focus-position variation range.

Additionally, for use as the portions on the mask design data which are subjected to exposure simulation, extract critical portions in process management (e.g., those portions large in resist profile change with respect to variations of the exposure and focus position) (1312). This extraction is performed by a procedure having the steps of theoretically or experientially defining the sensitivity (significance of change) of one or more feature quantities due to such exposure/focus-position variations from the exposure conditions (exposure wavelength, resist film thickness, resist material and others) and the line width and pitch width of a pattern, and determining whether it satisfies the standards for performing the monitoring of such exposure and focus position. The standards are determinable depending upon the monitor accuracy required: the higher the feature quantity sensitivity, the better the monitor accuracy. This can be said because if the feature quantity sensitivity is large then the withstandability increases against the influence due to a variation (offset) of secondary electron signal obtainable by the length-measure SEM during monitoring of a real wafer.

With the features stated supra, it becomes possible to automatically select an appropriate pattern or a combination of patterns most suitable for use in monitoring of the exposure machine's exposure and focus position.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

The invention claimed is:

1. A method for monitoring an exposure process comprising:

irradiating an electron beam onto a substrate having a surface with a resist pattern formed thereon through exposure and development in fabrication of a semiconductor device to thereby obtain a scanning electron microscope (SEM) image of the resist pattern formed on the surface of said substrate, the resist pattern having two types of line-and-space patterns different in pitch width from each other in which a sectional shape of one line-and-space pattern is a forward taper shape when a sectional shape of another line-and-space pattern is a reverse taper shape;

calculating a feature quantity of the resist pattern from the SEM image of the resist pattern thus obtained; and using information of the feature quantity of the resist pattern thus calculated and information as to a relationship between at least one parameter of processing conditions during said exposure and the feature quantity of the resist pattern formed on the substrate through the exposure and development and also information of a proper range of the feature quantity of the resist pattern to be formed on the substrate through the exposure and development to determine that a feature quantity of processing condition parameter exceeds an allowable range when the feature quantity of the resist pattern is out of said proper range.

2. The exposure process monitoring method according to claim 1, further comprising:

calculating a variation amount of the processing condition parameter based on the information of the feature quantity of the resist pattern thus calculated and the information as to a relationship between the processing condition parameter and the feature quantity of the resist pattern; and monitoring the exposure process based on the variation amount of the processing condition parameter thus calculated.

3. The exposure process monitoring method according to claim 2, wherein the variation amount of the processing condition parameter thus calculated is used to obtain a correction amount of processing conditions of said exposure process.

4. The exposure process monitoring method according to claim 3, further comprising:

displaying, on a screen, information as to the correction amount of the processing conditions of said exposure process thus obtained.

5. The exposure process monitoring method according to claim 1, wherein the feature quantity of the resist pattern calculated from the SEM image contains information items of three types of feature quantities consisting essentially of a line width of the resist pattern, a rounding degree of a top portion of the resist pattern, and a footing degree of a bottom portion of the resist pattern.

6. The exposure process monitoring method according to claim 1, wherein the resist pattern on the substrate is formed through exposure of a resist film using a Levinson phase shift mask during said exposure.

7. The exposure process monitoring method according to claim 1, wherein the information of the proper range of the feature quantity is obtained by using:
an exposure simulator for obtaining a sectional shape of the resist pattern formed on the substrate using design data of an exposure mask and information of the processing conditions during said exposure; and
an electron beam simulator for obtaining a secondary electron image obtainable upon irradiation of an electron beam onto the resist pattern having its sectional shape obtained by the exposure simulator.

8. An apparatus for monitoring an exposure process comprising:
image acquisition means for irradiating an electron beam onto a substrate having a surface with a resist pattern formed thereon through exposure and development in fabrication of a semiconductor device to thereby obtain a scanning electron microscope (SEM) image of the resist pattern formed on the surface of said substrate, the resist pattern having two types of line-and-space patterns different in pitch width from each other in which a sectional shape of one line-and-space pattern is a forward taper shape when a sectional shape of another line-and-space pattern is a reverse taper shape;
feature quantity calculation means for calculating a feature quantity of the resist pattern from the SEM image obtained by said image acquisition means;
storage means for storing therein information as to a relationship between at least one parameter of processing conditions during said exposure, a feature quantity of the resist pattern to be formed on the substrate during said exposure and information of a proper range of the feature quantity of the resist pattern as formed on the substrate through said exposure and development; and
determination means for determining, based on the information stored in said storage means as to the relationship between at least one parameter of processing conditions during said exposure, the feature quantity of the resist pattern and the proper range of the feature quantity of the resist pattern as formed on the substrate, that a feature quantity of the processing condition parameter exceeds an allowable range when the feature quantity of the resist pattern calculated by said feature quantity calculation means is out of said proper range.

9. The exposure process monitoring apparatus according to claim 8, wherein said determination means calculates a variation amount of the processing condition parameter based on the information of the feature quantity of the resist pattern calculated by said feature quantity calculation means and the information stored in said storage means as to the relationship between the processing condition parameter and the feature quantity of the resist pattern, and monitors the exposure process based on the variation amount of the processing condition parameter thus calculated.

10. The exposure process monitoring apparatus according to claim 8, further comprising:
calculator means for calculating a correction amount of the processing conditions of the exposure process based on the information of the processing condition parameter variation amount calculated by said determination means.

11. The exposure process monitoring apparatus according to claim 8, further comprising:
display means for displaying, on a screen, information as to the correction amount of the processing conditions of the exposure process obtained by said calculator means.

12. The exposure process monitoring apparatus according to claim 8, wherein the feature quantity of the resist pattern to be calculated by said feature quantity calculation means from the SEM image includes information items of three types of feature quantities consisting essentially of a line width of the resist pattern, a rounding degree of a top portion of the resist pattern, and a footing degree of a bottom portion of the resist pattern.

13. The exposure process monitoring apparatus according to claim 8, wherein said image acquisition means acquires the SEM image of the resist pattern formed by exposure using a Levinson phase shift mask.

14. The exposure process monitoring apparatus according to claim 8, wherein the information of the proper range of the feature quantity is obtained by using:
an exposure simulator for obtaining a sectional shape of the resist pattern formed on the substrate using design data of an exposure mask and information of the processing conditions during said exposure; and
an electron beam simulator for obtaining a secondary electron image obtainable upon irradiation of an electron beam onto the resist pattern having its sectional shape obtained by the exposure simulator.

* * * * *